United States Patent
Laux (10) Patent No.: US 7,091,078 B2
(45) Date of Patent: Aug. 15, 2006

(54) SELECTION OF OPTIMAL QUANTIZATION DIRECTION FOR GIVEN TRANSPORT DIRECTION IN A SEMICONDUCTOR DEVICE

(75) Inventor: Steven E. Laux, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/991,186

(22) Filed: Nov. 17, 2004

(65) Prior Publication Data

US 2006/0102985 A1    May 18, 2006

(51) Int. Cl.
H01L 21/8234   (2006.01)
H01L 21/8238   (2006.01)
H01L 21/836    (2006.01)

(52) U.S. Cl. .................................. 438/198; 438/292

(58) Field of Classification Search ........ 438/197–201, 438/292, 585
See application file for complete search history.

(56) References Cited

U.S. PATENT DOCUMENTS

2001/0030354 A1 * 10/2001 Shimizu et al. ............ 438/198

OTHER PUBLICATIONS

Baron, F. A. et al. "Manipulating the L-Valley Electron G Factor in Si-Ge Heterostructures." *Phys. Rev. B* 68, 195306 (2003).
Choi, Yang-Kyu et al. "Sub-20nm CMOS FinFET Technologies." *IEEE* (2001).
Low, Tony et al. "Investigation of Performance Limits of Germanium Double-Gates MOSFETs." *IEEE* (2003).
Laux, S. E. et al. "Analysis of Quantum Ballistic Electron Transport in Ultrasmall Silicon Devices Including Space-Charge and Geometric Effects." *J. Appl. Phys.* 95, 10 5545 (2004).
Guarini, K. W. et al. "Triple-Self-Aligned, Planar Double-Gate MOSFETs: Devices and Circuits." *IEEE* (2001).
Na, M. H. et al. "The Effective Drive Current in CMOS Inverters." *IEEE* (2002).

* cited by examiner

*Primary Examiner*—Cuong Nguyen
(74) *Attorney, Agent, or Firm*—Scully, Scott, Murphy & Presser, P.C; Wan Yee Cheung, Esq.

(57) ABSTRACT

A technique for selecting an optimal quantization direction for a given transport direction in a semiconductor device such as a field effect transistor (FET), a method for preparing a wafer for fabricating such a semiconductor device, and the semiconductor device fabricated by the method. A switching time is calculated for different candidate quantization directions, and for a given current transport direction. The quantization direction that results in the lowest switching time is then determined. In a specific example, Ge nFET performance is enhanced by 12% using the [1 1 0] and [$\bar{4}$ 4 21] crystallographic directions for transport and quantization, respectively. Quantization in the [$\bar{1}$ 1 0] direction was previously considered optimal.

17 Claims, 4 Drawing Sheets

SELECTION OF OPTIMAL QUANTIZATION DIRECTION FOR GIVEN TRANSPORT DIRECTION IN A SEMICONDUCTOR DEVICE

BACKGROUND OF THE INVENTION

The invention relates generally to the field of semiconductors and, more specifically, to a technique for selecting an optimal quantization direction for a given transport direction in a semiconductor device such as a field effect transistor (FET), a method for preparing a wafer for fabricating such a semiconductor device, and the semiconductor device fabricated by the method.

It is known that FET performance varies with crystallographic direction. See M. Yang et al., "High Performance CMOS Fabricated On Hybrid Substrate With Different Crystal Orientations," *IEDM Tech. Digest,* 2003, p. 453–456. In the case of Ge nFETs, the commonly held belief is that the best performance is obtained for transport in the [1 1 0] direction, with quantization in the [$\bar{1}$ 1 0] direction. See T. Low et al., "Investigation of Performance Limits of Germanium Double-Gated MOSFETs," *International Electron Devices Meeting (IEDM)*, p. 691–694, December 2003, incorporated herein by reference. Low, et al. modeled Ge DGFETs in a few crystallographic directions of high symmetry and concluded the best combination of high quantization mass and low transport mass occurred for transport in the [1 1 0] and quantization in the [$\bar{1}$ 1 0] direction.

BRIEF SUMMARY OF THE INVENTION

To address the above and other issues, the present invention provides a method for selecting an optimal quantization direction for a given transport direction in a semiconductor device such as a field effect transistor (FET), a method for preparing a wafer for fabricating such a semiconductor device, and the semiconductor device fabricated by the method.

A technique is provided herein to improve upon the FET performance by choosing a different set of transport/quantization directions. This new choice is unanticipated and may be useful in improving the performance of other semiconductor devices as well. The principle behind the choice of transport/quantization directions and the associated performance increase will be described, using a Ge n-channel double gate field effect transistor (DGFET) as a specific example for which detailed calculations have been made. However, the principles discussed are more generally applicable.

In a particular aspect of the invention, a method is provided for determining an optimal crystallographic quantization direction for a semiconductor device having a source, drain and gate. The method includes selecting a crystallographic current transport direction for the semiconductor device which is in a direction from the source to the drain of the semiconductor device, where the gate controls a quantization of electrons moving in the crystallographic current transport direction in a channel between the source and drain. For each of a number of different candidate crystallographic quantization directions, and based on the selected crystallographic current transport direction, a metric is calculated. The present method further includes determining which of the different candidate crystallographic quantization directions results in an optimization of the metric.

In another aspect, a method for preparing a wafer for fabricating a semiconductor device having a source, drain and gate, includes: (a) selecting a crystallographic current transport direction for the semiconductor device which is in a direction from the source to the drain of the semiconductor device, wherein the gate controls a quantization of electrons moving in the crystallographic current transport direction in a channel between the source and drain, (b) for each of a number of different candidate crystallographic quantization directions, and based on the selected crystallographic current transport direction, calculating a metric, (c) determining which of the different candidate crystallographic quantization directions results in an optimization of the metric, and (d) grinding a surface of the wafer at an angle corresponding to the crystallographic quantization direction that results in the optimization of the metric.

The wafer obtained by the above-mentioned method is also provided.

A further aspect of the invention includes a Germanium n-type double gate field effect transistor having a source, a drain, a channel between the source and the drain, and a gate for controlling a quantization of electrons moving in a crystallographic current transport direction in the channel between the source and the drain. The crystallographic current transport direction is [1 1 0], and a crystallographic quantization direction is [$\bar{4}$ 4 21] or its equivalents.

BRIEF DESCRIPTION OF THE DRAWINGS

These and other features, benefits and advantages of the present invention will become apparent by reference to the following text and figures, with like reference numbers referring to like structures across the views, wherein.

DETAILED DESCRIPTION OF THE INVENTION

Ge nFET performance is enhanced by a choice of how transport and quantization directions of the device are aligned with specific crystallographic directions of Ge. In a specific example, Ge nFET performance is enhanced using the [1 1 0] and [$\bar{4}$ 4 21] crystallographic directions for transport and quantization, respectively. This specific example of performance increase illustrates a general principle that is applicable to any semiconducting material which has multiple energy minima as a function of momentum (i.e., multiple energy minima in so called k-space). If these energy minima are offset in energy, it is possible, via quantization, to redistribute the relative occupancy of these energy minima so that conduction benefits from the presence of multiple minima, as will be described. This addition of quantum conduction channels increases the device current, and conditionally, the device's performance. Performance will increase if the new conduction configuration results in a net higher velocity through the device's channel, as is found for the case of nFETs in Ge.

The technique for increasing Ge nFET performance is a specific case of a more general principle of how to enhance device performance, to be discussed subsequently. Note for specificity, actual crystal directions are specified; however, equivalent directions are implied.

Figure 1:
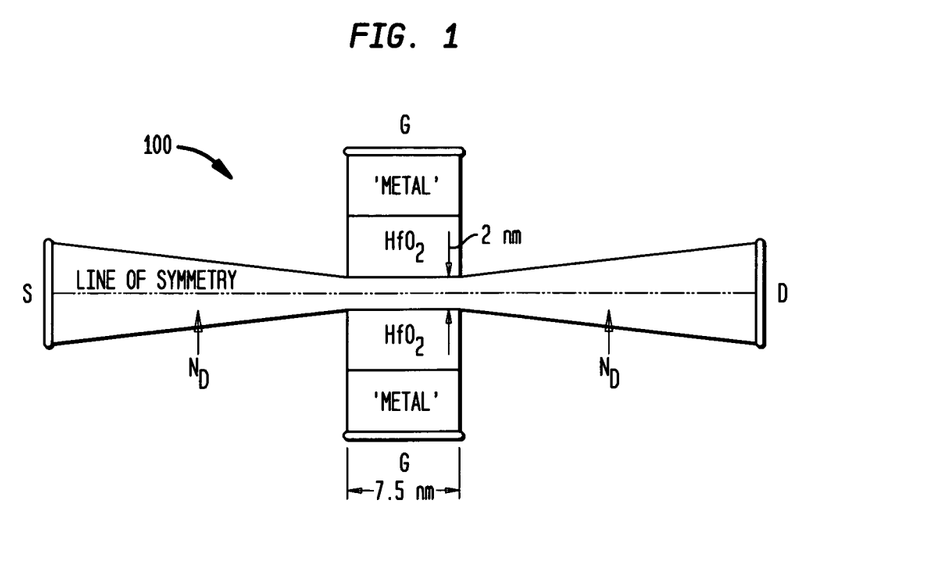
FIG. 1 illustrates a double gate field effect transistor (DGFET), according to the invention.

Consider the Ge DGFET 100 illustrated in FIG. 1. In particular, FIG. 1 illustrates a Ge DGFET structure with a 7.5 nm gate length and 2 nm channel thickness. The transport direction is from source (S) to drain (D), i.e., the horizontal direction. The vertical direction, extending between the two gates (G), is the quantization direction. Specifically, the gates are modulated to set the size of the channel. When the channel becomes sufficiently narrow, such as 2 nm, electrons passing through the channel can only assume discrete or quantized states. The device is assumed to not vary in the direction extending out of the page. Source and drain dopings, shown lightly shaded, are $N_D=2\times10^{20}$ cm$^{-3}$; the channel is undoped. The gate insulator is modeled as HfO$_2$, whose effective (SiO$_2$) oxide thickness is 0.6 nm. An arbitrary gate metal is assumed which will result in a threshold voltage of 0.15 V.

Note that a semiconductor device with a gate is not necessary since quantization can occur in a channel without a gate. Furthermore, the concept of the invention may be applied as well to p-type FETs, but the specific numbers, alignments, etc. quoted here, would all change.

Device performance is assessed as follows: terminal currents and internal mobile electron charge density are determined by solving the Schrödinger and Poisson equations self-consistently. See S. Laux et al., "Analysis of quantum ballistic electron transport in ultrasmall silicon devices including space-charge and geometric effects", *J. Appl. Phy.* 95(10):5545–5582, May 15, 2004, incorporated herein by reference. No electron or impurity scattering is included in the calculation, i.e., these quantities are computed in the ballistic limit, which is applicable to the extremely small device structure being considered here. A power supply voltage $V_{DD}=0.5$ V is assumed in view of the extremely short channel length device being considered. A threshold voltage $V_T=0.15$ V is obtained by adjusting the gate metal workfunction appropriately. An effective drive current to assess logic switching performance (see M. Na et al., "The Effective Drive Current In CMOS Inverters", *IEDM Tech. Digest*, 2002, p. 121–124, incorporated herein by reference) is computed as $\bar{I}=0.5\times[I_D(V_{GS}=V_{DD}/2; V_{DS}=V_{DD})+I_D(V_{GS}=V_{DD}; V_{DS}=V_{DD}/2)]$. To switch the device, this current must supply a charge equal to the difference in electron charge present in the device in the 'on' and 'off' states, $Q_n(V_{GS}=V_{DD}; V_{DS}=0)$ and $Q_n(V_{GS}=0; V_{DS}=V_{DD})$, respectively. The time for switching is then given by $\tau=\Delta Q_n/\bar{I}$. Best performance is obtained by minimizing $\tau$. Since small charge and large current will decrease $\tau$, this is equivalent to finding situations which maximize velocity, since current is the product of charge and velocity.

Figure 2:
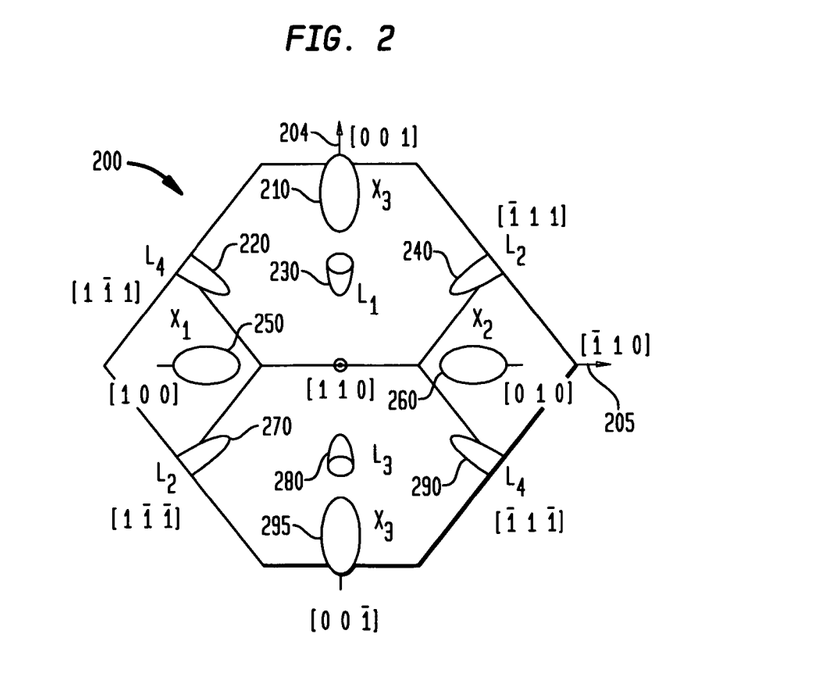
FIG. 2 illustrates the Brillouin zone of Ge, aligned as in FIG. 3, according to the invention.
Figure 3:
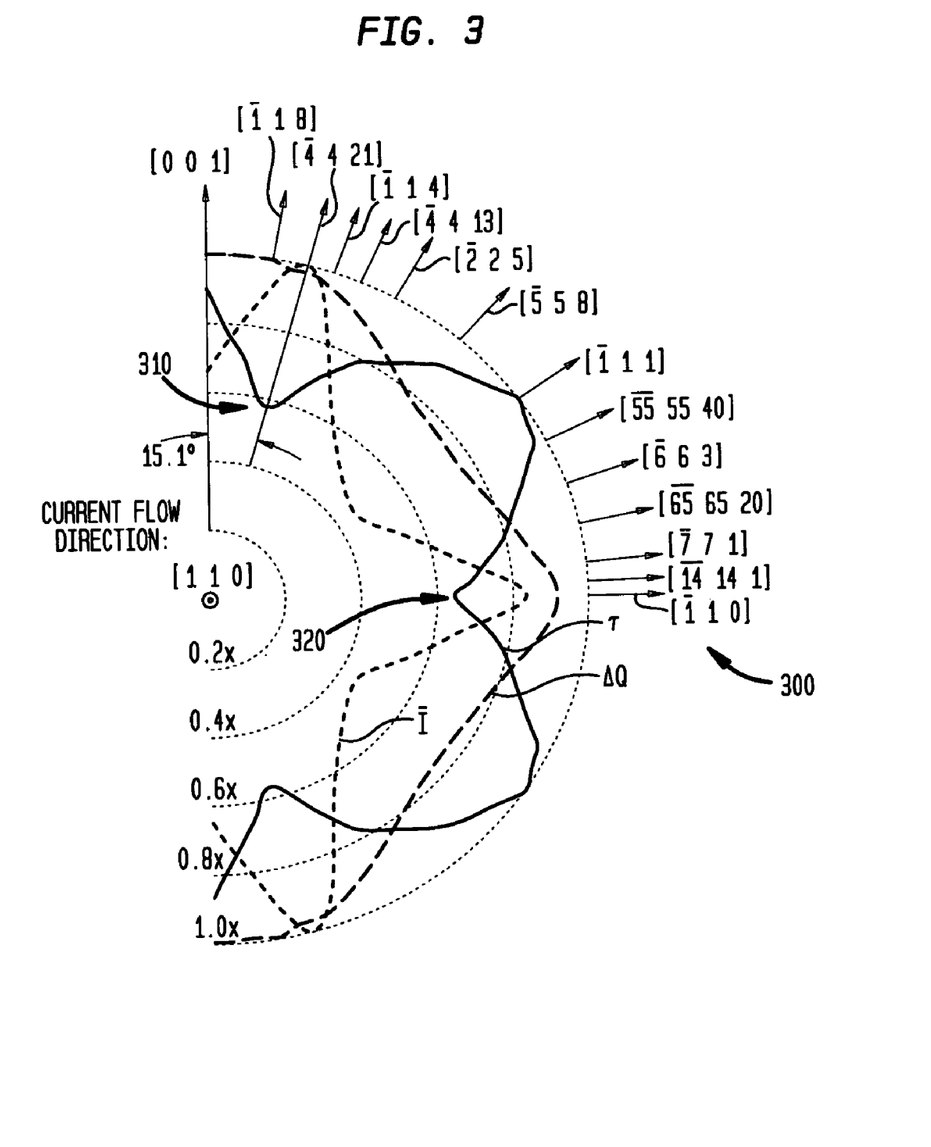
FIG. 3 illustrates a plot of switching time τ, change in mobile charge ΔQ, and drive current Ī versus quantization direction, for a fixed current flow direction along the [1 1 0] direction (out of page direction), according to the invention.

FIG. 2 illustrates the Brillouin zone 200 of Ge, aligned as in FIG. 3, according to the invention. The Brillouin zone can be thought of a 3-D object with a number of flat faces, where FIG. 2 shows a projection of the zone onto the plane of the paper. Each point inside the zone represents a possible energy and wavelength that an electron can assume as it moves in a crystal, such as in the channel of the device 100 of FIG. 1. The center of the figure shows the current direction [1 1 0], which is coming out of the page. Furthermore, electrons in the zone prefer to reside in valleys where the energy is at a local minima. An L valley is defined as an intersection point with the [1 1 1] and equivalent crystallographic directions, while an X valley is defined as an intersection point with the [1 0 0] and equivalent crystallographic directions. L valleys are alike, and X valleys are alike. Furthermore, the valleys have shapes that reveal how electrons behave when pushed on in certain directions. These shapes are indicated by the ellipsoid shapes in FIG. 2. In particular, rules for determining which valley carries current for a given quantization direction are: (a) a valley that is long in the quantization direction indicates current can be easily carried (the quantization mass is large; therefore there are more current channels), (b) a valley that is short in the current direction indicates current can be easily carried (the transport mass is small; therefore higher velocity), (c) an L valley carries more current than an X valley with all other factors being equal (due to their energy offset in Ge).

For example, the major axis of the ellipsoid X$_3$ 210 or 295 extends in the plane of FIG. 2, perpendicular to the [1 1 0] current direction. This means the ellipsoid is short in the current direction. Moreover, the major axis of the ellipsoid X$_3$ 210 or 295 is parallel to the [0 0 1] quantization direction, indicated by the arrow 204. This means the ellipsoid X$_3$ 210 or 295 is long in the [0 0 1] direction. Thus, X$_3$ dominates near [0 0 1]. Based on these factors, electrons in the X$_3$ valley can flow easily in the channel for the given quantization direction of [0 0 1]. However, for the quantization direction [$\bar{1}$ 1 0], indicated by the arrow 205, the ellipsoid X$_3$ 210 or 295 is short in the quantization direction. Based on these factors, electrons in the X$_3$ valley flow less easily in the channel for the given quantization direction of [$\bar{1}$ 1 0]. The other ellipsoids can be interpreted accordingly.

As a further example in interpreting FIG. 2, ellipsoids X$_1$ 250 and X$_2$ 260 are long in the [1 0 0] or [$\bar{1}$ 1 0] directions, just as long as ellipsoid X$_3$ 210 or 295 is in the [0 0 1] or [0 0 $\bar{1}$] directions. It can also be shown that ellipsoid L$_4$, having portions 220 and 290, is long in the [1 $\bar{1}$ 1] and [$\bar{1}$ 1 $\bar{1}$] directions, and ellipsoid L$_2$, having portions 240 and 270, is long in the [$\bar{1}$ 1 1] and [1 $\bar{1}$ $\bar{1}$] directions. Ellipsoids L$_1$ 230 and L$_3$ 280 are also indicated. L$_2$=L$_4$ at [$\bar{1}$ 1 0].

The Brillouin zone 200 can be understood further in view of FIG. 3. FIG. 3 shows a plot 300 of switching time $\tau$, change in mobile charge $\Delta Q$, and drive current $\bar{I}$ versus quantization direction, for the fixed current flow direction along the [1 1 0] direction (out of page direction). $\tau_{MAX}=0.181$ psec., $\Delta Q_{MAX}=8.42\times10^6$ cm$^{-1}$, and $\bar{I}_{MAX}=25.27$ A/cm. Each curve is normalized to a maximum value at 1× as shown. Values increase radially away from the 'center' of the semi-circle. The complete angular dependence about a full circle can be recovered by folding the semicircle along its vertical diameter. FIG. 2 represents the Brillouin zone of Ge, aligned as in the plot of FIG. 3.

In particular, FIG. 3 shows the switching time $\tau$ as a function of alignment of the quantization direction of the device, for a fixed transport direction of [1 1 0]. The smallest $\tau$, and hence the best performance, is obtained with quantization in the [$\bar{4}$ 4 21] direction, as indicated by point 310. This important result is realized using the technique of the present invention. For comparison, point 320 indicates the approximately 12% higher switching time $\tau$ realized with a quantization direction of [$\bar{1}$ 1 0], which was previously considered optimal with the current transport direction of [1 1 0].

In this orientation, with quantization in the [$\bar{4}$ 4 21] direction, current flow is evenly split between one L valley ($L_2$) and two X valleys ($X_3$). As the quantization direction moves away from [$\bar{4}$ 4 21] towards [$\bar{1}$ 1 0] the current flow is dominated by $L_2$, while towards [0 0 1] it is dominated by $X_3$. Note that the quantization directions are indicated only for the upper right quadrant of a circle for the plot 300. Due to symmetry of the Brillouin zone, equivalent directions apply at the remaining quadrants. For instance, the [0 0 1] direction at the top of the plot 300 has an equivalent of [0 0 –1] at the bottom of the plot 300, the direction [$\bar{4}$ 4 21] has an equivalent at [4 $\bar{4}$ $\overline{21}$], and so forth. For example, the equivalents of [$\bar{4}$ 4 21] are obtained by twenty-three variations in which 4 and/or $\bar{4}$ appear twice, and 21 or $\overline{21}$ appears once, as follow: [4 4 21], [4 4 $\overline{21}$], [4 $\bar{4}$ 21], [4 $\bar{4}$ $\overline{21}$], [$\bar{4}$ 4 $\overline{21}$], [$\bar{4}$ $\bar{4}$ 21], [$\bar{4}$ $\bar{4}$ $\overline{21}$], [4 21 4], [4 21 $\bar{4}$], [4 $\overline{21}$ 4], [4 $\overline{21}$ $\bar{4}$], [$\bar{4}$ 21 4], [$\bar{4}$ 21 $\bar{4}$], [$\bar{4}$ $\overline{21}$ 4], [$\bar{4}$ $\overline{21}$ $\bar{4}$], [21 4 4], [21 4 $\bar{4}$], [21 $\bar{4}$ 4], [21 $\bar{4}$ $\bar{4}$], [$\overline{21}$ 4 4][$\overline{21}$ 4 $\bar{4}$], [$\overline{21}$ $\bar{4}$ 4], [$\overline{21}$ $\bar{4}$ $\bar{4}$].

Which valleys carry the current for a given quantization direction can be qualitatively understood using the Brillouin zone of FIG. 2. Three facts must be considered: (1) in bulk Ge, the X valleys are ~173 meV more energetic than the L valleys; since lower energy generally means higher occupancy—this favors L valley occupancy. (2) A large quantization mass favors higher occupancy, as an energy level is not increased too much in the thin channel. A large quantization mass corresponds to an energy valley that is elongated in the quantization direction. (3) A larger velocity favors larger current flow and occurs for a smaller transport mass, corresponding to a minimal elongation of the energy valley in the transport direction i.e., in the out-of-page direction.

Knowing all this, for quantization in the [$\bar{1}$ 1 0] direction, the $L_2$ and $L_4$ valleys dominate current flow: they reside below all X valleys in energy, and only these two valleys are elongated in the quantization direction and minimally elongated in the out-of-page direction. Moving now towards the [$\bar{1}$ 1 1] quantization direction, the $L_4$ valley becomes less elongated in the quantization direction, and only $L_2$ carries the current. Approaching the [0 0 1] quantization direction, the relatively poor alignment of $L_2$ and the improving alignment of $X_3$ ultimately allow the $X_3$ valleys to dominate the current flow. Between [$\bar{1}$ 1 1] and [0 0 1] quantization directions, the L and X valley current components become equal. Performance is enhanced by the use of both $L_2$ and $X_3$ to carry current in roughly equal amounts, as the net electron velocity is larger than for either valley alone. Ordinarily, in bulk Ge, the energy splitting between X and L precludes them from cooperating effectively. This situation is altered in the DGFET, however, by proper choice of channel quantization and crystallographic alignment according to the invention.

Figure 4:
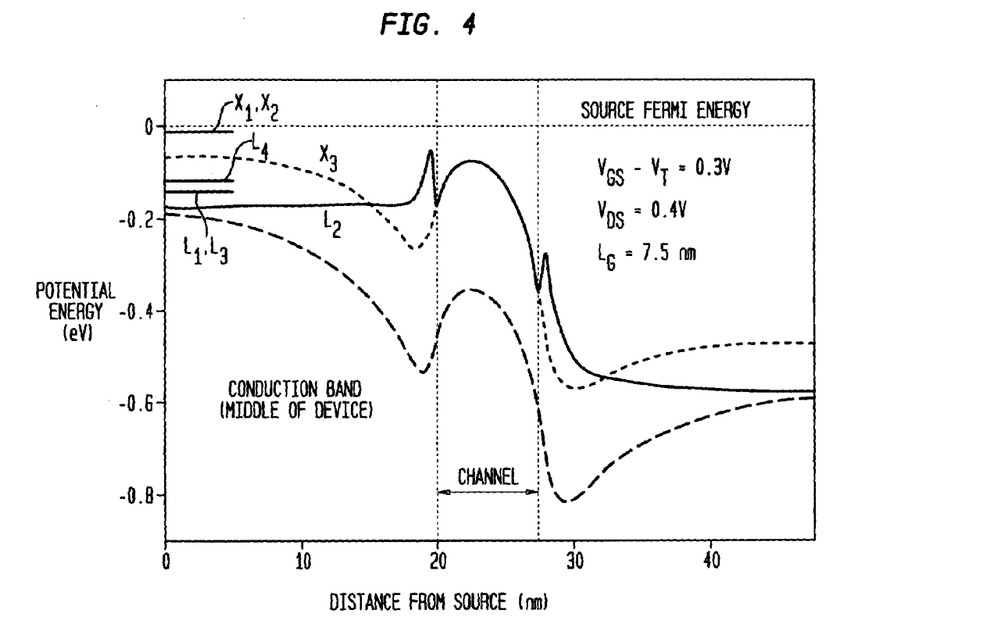
FIG. 4 illustrates a plot of subband potential energy versus position away from the DGFET source, according to the invention.

FIG. 4 shows subband potential energy versus position away from the DGFET source. At the source, the precise energies of the four L valleys and three X valleys are indicated by line segments. The conduction band potential energy (long dash) is also shown as sampled along the center of the device channel. The subband potential energies are approximate in nature, as they are computed from the one-dimensional conduction band potential in the quantization direction at the position shown. The actual device computation quantizes in two dimensions, and hence, smears out the two 'spikes' in the $L_2$ subband potential energy that are artifacts of the one-dimensional estimation.

In particular, FIG. 4 shows the subband potential energies along the DGFET channel for the [1 1 0]/[$\bar{4}$ 4 21] transport/quantization orientation and demonstrates the proper choice of quantization strength (set via device channel thickness) and crystallographic alignment. The energy levels near the source (far left) show the anticipated ordering in energy: L below X. While all four L and three X valley energies are shown, only two ($L_2$ and $X_3$) are continued down the device channel, as only these two energy levels carry significant current. In the channel region, the $L_2$ and $X_3$ subband potential energies become equal: the large quantization experienced by $L_2$ (small quantization mass 0.1862 $m_o$) is equal to the modest quantization experienced by $X_3$ (large quantization mass 0.7303 $m_0$) plus the 173 meV energy offset of the $X_3$ valley. It is this near equality of subband potentials that permits both valleys to carry similar current magnitudes. But furthermore note: the double degeneracy of the $X_3$ valley, which should increase current by twofold, is roughly compensated by its smaller velocity: the $X_3$ transport mass (0.2030 $m_0$) is more that twice as large as the $L_2$ transport mass (0.0815 $m_0$). Thus, overall, the current carried in $L_2$ and $X_3$ valleys are approximately equal. And in this configuration, the net electron velocity is larger than in either $L_2$ or $X_3$ alone, resulting in a FET performance enhancement. A 12% decrease in τ is obtained compared to the [1 1 0]/[$\bar{1}$ 1 0] orientation previously considered optimal (0.104 psec vs. 0.118 psec from FIG. 3).

Such a device could be fabricated as follows. If the DGFET is of the 'planar' type (see K. Guarini, et al. "Triple-Self-Aligned, Planar Double-Gate MOSFETs: Devices and Circuits", *IEDM Tech. Digest*, 2001, p. 425–428), then the starting Ge wafer could be obtained as follows: (i) obtain a Ge wafer with the [0 0 1] direction perpendicular to the wafer surface. (ii) Identify the [1 1 0] direction on the wafer surface. (iii) Grind away the wafer surface at a 15.1° angle from vertical, while keeping the grinding surface parallel to the [1 1 0] direction. This will create a wafer with the [$\bar{4}$ 4 21] direction perpendicular to the wafer surface. DGFET fabrication would then proceed using this wafer, while insuring the current flow direction stays in the [1 1 0] direction. If the DGFET is of the 'FinFET' type (see Y. Choi, et al., "Sub-20 nm CMOS FinFET Technologies", *IEDM Tech. Digest*, 2001, p. 425–428), then starting wafer preparation is as follows: (i) obtain a Ge wafer with the [0 1 1] direction perpendicular to the wafer surface. (ii) Identify the [1 1 0] direction on the wafer surface. (iii) Grind away the wafer surface at a 15.1° angle from vertical, while keeping the grinding surface parallel to the [1 1 0] direction. The 15.1° angle from vertical can be seen in FIG. 3. This will create a wafer with the [$\overline{21}$ 21 $\bar{8}$] direction perpendicular to the wafer surface. DGFET fabrication would then proceed using this wafer, while insuring the current flow direction remains the [1 1 0] direction.

The above-described detailed example illustrates a guiding principle of the present invention: device performance can potentially be improved by exploiting conduction in multiple energy valleys, valleys which can be caused to cooperate in conduction by combining crystallographic alignment (and its influence on quantization/transport masses), and quantization strength (which sets energy level offsets). These two features of design can be used to overcome the bulk energy separation between energy valleys that would otherwise preclude their cooperation. We demonstrate with this Ge DGFET example that a proper choice of alignment and channel thickness can be used to enhance performance, owing to the net increase in electron velocity obtained in the cooperative conduction in L and X valleys in Ge. It is anticipated that other semiconducting materials would allow similar benefits in performance by combining conduction through cooperative energy valleys, valleys that only cooperate because both quantization and crystallographic alignment are used together to overcome a bulk energy separation between such valleys.

Figure 5:
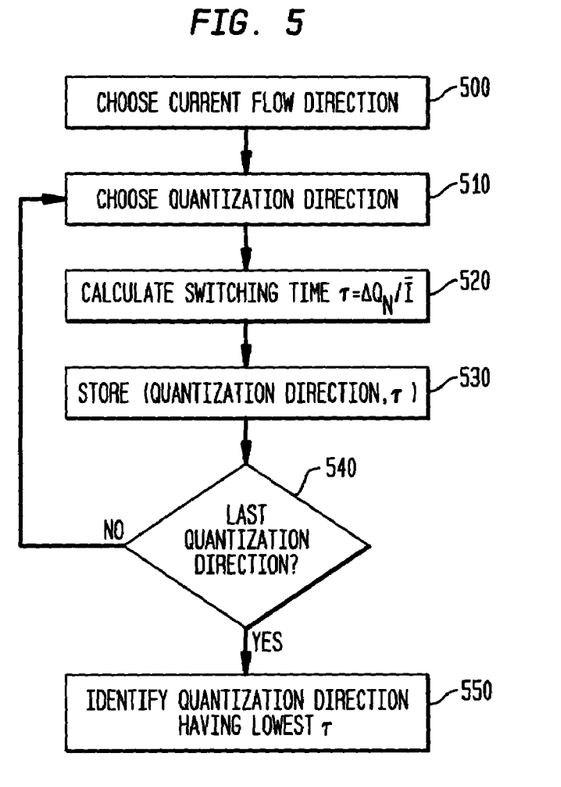
FIG. 5 illustrates a method for determining an optimal crystallographic quantization direction for a semiconductor device, according to the invention.

FIG. 5 provides a summary of the above-mentioned method for determining an optimal crystallographic quantization direction for a semiconductor device. At block 500, a current flow direction is chosen. At block 510, an initial quantization direction is chosen. At block 520, the switching time is calculated. At block 530, the combination of quantization direction and switching time is stored. At block 540, if there are additional quantization directions, the process is repeated at blocks 510, 520 and 530. Generally, different candidate quantization directions for a given transport direction may be considered. For example, in the example of FIG. 3, each of the quantization directions in the upper right hand quadrant were considered to arrive at the switching time curve. It is not necessary to consider the equivalent crystallographic directions since the switching time is the same. Once the switching time has been calculated for each quantization direction and the last quantization direction has been considered (block 540), the quantization direction which resulted in the lowest, e.g., optimal, switching time is identified (block 550). Thus, the metric of switching time is optimized.

Figure 6:
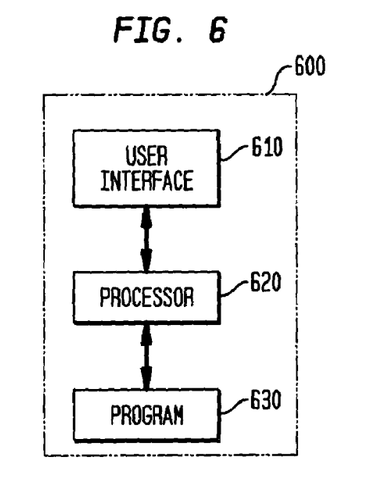
FIG. 6 illustrates an apparatus for performing the method of FIG. 5, according to the invention.

FIG. 6 illustrates an apparatus for performing the method of claim 5, according to the invention. The method may be performed using a general-purpose computer 600, for instance, having a program storage device 630 for storing software instructions that are executed by a processor 620 to achieve the desired functionality. The program storage device 630 may be a portable media such as a CD-ROM on which the software is stored, or a storage resource in the computer 100 such as a hard disk, for instance. A user interface 610 such as a screen and an input device allows the user to run the software to obtained the desired results. Note that the computer 100 may also be used in conjunction with a semiconductor fabrication machine to automatically control the machine to provide a wafer having the desired characteristics.

The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention, which is defined by the appended claims.

What is claimed is:

1. A method for determining an optimal crystallographic quantization direction for a semiconductor device having a source, drain and channel, the method comprising:
   selecting a crystallographic current transport direction for the semiconductor device which is in a direction from the source to the drain of the semiconductor device, wherein the electrons moving in the crystallographic current transport direction in a channel between the source and the drain have quantized energy states;
   calculating a metric for each of a number of different candidate crystallographic quantization directions, based on the selected crystallographic current transport direction; and
   determining which of the different candidate crystallographic quantization directions results in an optimization of the metric.

2. The method of claim 1, wherein:
   the semiconductor device comprises a double gate field effect transistor.

3. The method of claim 1, wherein:
   the semiconductor device comprises a Germanium n-type double gate field effect transistor.

4. The method of claim 3, wherein:
   when the selected crystallographic current transport direction is [1 1 0], the crystallographic quantization direction that results in the optimization of the metric is [$\bar{4}$ 4 21] or its equivalents.

5. The method of claim 1, wherein:
   the crystallographic quantization direction that results in the optimization of the metric is that which provides a similar magnitude of current transport for: (a) electrons having an energy state characterized by at least one L valley while in the channel, and (b) electrons having an energy state characterized by at least one X valley while in the channel.

6. The method of claim 1, wherein:
   the metric comprises a switching time.

7. The method of claim 6, wherein:
   the switching time for the semiconductor device is calculated based on a ratio of $\Delta Q_N$ to $\bar{I}$, where $\Delta Q_N$ represents a difference in electron charge present in the semiconductor device between on and off states, and $\bar{I}$ represents an effective drive current.

8. The method of claim 1, wherein:
   the method is computer-implemented.

9. At least one program storage device tangibly embodying at least one program of instructions executable by at least one processor for performing the method of claim 1.

10. A method for preparing a wafer for fabricating a semiconductor device having a source, drain and channel, comprising:
    selecting a crystallographic current transport direction for the semiconductor device which is in a direction from the source to the drain of the semiconductor device, wherein electrons moving in the crystallographic current transport direction in a channel between the source and drain have quantized energy states;
    calculating a metric for each of a number of different candidate crystallographic quantization directions, based on the selected crystallographic current transport direction;
    determining which of the different candidate crystallographic quantization directions results in an optimization of the metric; and
    grinding a surface of the wafer at an angle corresponding to the crystallographic quantization direction that results in the optimization of the metric.

11. The method of claim 10, wherein:
    the semiconductor device comprises a planar type double gate field effect transistor;
    the wafer comprises a Germanium wafer with a [0 1 1] direction perpendicular to the surface;
    the method further includes identifying a [1 1 0] direction on the surface; and
    the grinding comprises grinding the surface at about a 15.1 degree angle from vertical, while keeping a grinding surface parallel to the [1 1 0] direction, to create a wafer with a [$\bar{4}$ 4 21] direction perpendicular to the surface.

12. The method of claim 10, wherein:
    the semiconductor device comprises a FinFET type double gate field effect transistor;
    the wafer comprises a Germanium wafer with a [0 1 1] direction perpendicular to the surface;

the method further includes identifying a [1 1 0] direction on the surface; and the grinding comprises grinding the surface at about a 15.1 degree angle from vertical, while keeping a grinding surface parallel to the [1 1 0] direction, to create a wafer with a [$\overline{2 1}$ 21 $\overline{8}$] direction perpendicular to the surface.

13. The method of claim 10, wherein:

the semiconductor device comprises a Germanium n-type double gate field effect transistor.

14. The method of claim 13, wherein:

when the selected crystallographic current transport direction is [1 1 0], the crystallographic quantization direction that results in the optimization of the metric is [$\overline{4}$ 4 21] or its equivalents.

15. The method of claim 10, wherein:

the crystallographic quantization direction that results in the optimization of the metric is that which provides a similar magnitude of current transport for: (a) electrons having an energy state characterized by at least one L valley while in the channel, and (b) electrons having an energy state characterized by at least one X valley while in the channel.

16. The method of claim 10, wherein:

the metric comprises a switching time.

17. The method of claim 16, wherein:

the switching time for the semiconductor device is calculated based on a ratio of $\Delta Q_N$ to $\tilde{I}$, where $\Delta Q_N$ represents a difference in electron charge present in the semiconductor device between on and off states, and $\tilde{I}$ represents an effective drive current.

* * * * *

UNITED STATES PATENT AND TRADEMARK OFFICE
CERTIFICATE OF CORRECTION

PATENT NO. : 7,091,078 B2
APPLICATION NO. : 10/991186
DATED : August 15, 2006
INVENTOR(S) : Steven E. Laux It is certified that error appears in the above-identified patent and that said Letters Patent is hereby corrected as shown below:

Title Page: Other Publication: item (56),
"Low, Tony et al. "Investigation of Performance Limits of Germanium Double-Gated MOSFETs." IEEE (2003)."

should read

-- Low, Tony et al. "Investigation of Performance Limits of Germanium Double-Gated MOSFETs." IEEE (2003). --

Column 8, Line 53, Line 11:
"[0 1 1]" should read -- [0 0 1] --

Signed and Sealed this

Twenty-sixth Day of December, 2006

JON W. DUDAS
*Director of the United States Patent and Trademark Office*